United States Patent [19]

Spadafora

[11] Patent Number: 4,572,757
[45] Date of Patent: Feb. 25, 1986

[54] METHOD OF MAKING A MICROCIRCUIT SUBSTRATE

[75] Inventor: Vincent A. Spadafora, Churchville, Pa.

[73] Assignee: The Jade Corporation, Southhampton, Pa.

[21] Appl. No.: 573,084

[22] Filed: Jan. 23, 1984

[51] Int. Cl.⁴ .................. B32B 31/20; H01L 23/48
[52] U.S. Cl. .................................. 156/252; 29/827; 29/837; 29/839; 29/840; 29/842; 29/843; 29/852; 357/69; 357/70
[58] Field of Search .............. 156/89, 252, 253; 228/228, 242; 29/827, 837, 838, 840, 842, 843, 874, 876, 877, 878, 879, 825, 829, 839, 851, 852; 357/69, 70

[56] References Cited

U.S. PATENT DOCUMENTS

| | | | |
|---|---|---|---|
| 3,780,431 | 12/1973 | Feeney | 29/839 |
| 3,926,746 | 12/1975 | Hargis | 204/15 |
| 4,224,637 | 9/1980 | Hargis | 357/70 |
| 4,288,841 | 9/1981 | Gogal | 357/70 |
| 4,331,740 | 5/1982 | Burns | 29/827 |

Primary Examiner—Caleb Weston
Attorney, Agent, or Firm—Seidel, Gonda, Goldhammer & Abbott

[57] ABSTRACT

Individual ceramic substrates for electronic microcircuits are formed in an array having rectangular perforations which define score lines along which the array is broken to yield the individual substrates. The surfaces of the rectangular perforations are metallized and leads are attached thereto by thermocompression bonding after the array is broken. The rectangular perforations result in semi-rectangular openings around the periphery of the individual substrates, which eliminate tensile forces on the substrate during lead bonding.

4 Claims, 6 Drawing Figures

METHOD OF MAKING A MICROCIRCUIT SUBSTRATE

BACKGROUND OF THE INVENTION

Electronic microcircuits have enjoyed phenomenal growth since their introduction in the 1960's, and are used in a wide range of applications.

Electronic microcircuits, often referred to as "chips", may be either integrated circuits, where each individual circuit element is fabricated on a single piece of semiconductor material, or hybrid microcircuits, in which individual electronic components, including integrated circuits, are mounted on a substrate and interconnected by conductors fabricated on the surface of the substrate or by wires or both. Although the present invention will be illustrated in the context of integrated microcircuits, it should be recognized that the invention is applicable to both integrated microcircuits and hybrid microcircuits.

Integrated microcircuits, or "chips", are typically manufactured in arrays of large numbers of individual circuits on a wafer of semiconductor material. After manufacture, individual chips are separated from the wafer and are mounted on a substrate. The substrate supports the individual chip and the leads which enable the microcircuit to be connected to a circuit board. The microcircuit and the substrate may be encapsulated in a plastic or similar material.

The substrate is typically made of either plastic or ceramic material. Ceramic material has a number of well-known advantages over plastic. A ceramic substrate can be hermetically sealed, whereas a plastic substrate cannot. Ceramic can also withstand higher temperatures than plastic. Another advantage of a ceramic substrate is that during reflow soldering, the device can better withstand thermal mismatch because the ceramic expands at a predictable rate. The leads can be designed to yield to compensate for the differences in thermal expansion between a ceramic substrate and its plastic package.

Ceramic substrates are typically made out of aluminum oxide (alumina). However, other ceramic materials possessing special properties may be used. For example, beryllium oxide (beryllia) may be used when superior heat conductivity is required, titania may be used where high dielectric strength is required, and black ceramics may be used where no light emission or penetration is desired.

Although different ceramic materials offer different properties in one way or another, all ceramic materials share a common drawback. Ceramic can withstand very large compression forces but practically no tensile forces. This disadvantage has made it extremely difficult to side bond leads to ceramic substrates using thermocompression bonding or thermosonic bonding. In order to bond leads to the sides of ceramic substrates, it has been necessary in the past to braise the leads to the substrate. However, braising has the disadvantage of requiring high temperatures, which in turn limits the kinds of materials that can be used for the leads. For example, copper cannot be used because it oxidizes at braising temperatures.

The present invention makes it possible to thermocompression bond leads to the sides of a ceramic substrate. It is thus no longer necessary to braise the leads to the sides of the substrate. Copper leads can now be used, rather than more exotic alloys.

SUMMARY OF THE INVENTION

The inventionn includes a method of making individual microcircuit ceramic substrates. An integral array of a plurality of individual substrates is constructed on a sheet of ceramic material. Rectangular holes are formed in the ceramic material along score lines which define the periphery of individual substrates. The individual substrates are separated from the array by breaking the array along the score lines to yield individual substrates having semi-rectangular openings around the periphery of each substrate. At least one surface of the semi-rectangular openings is metallized, and leads are bonded to the substrate at the semi-rectangular openings by thermocompression bonding.

The invention also includes a ceramic substrate for an electronic microcircuit, the substrate having a plurality of semi-rectangular openings around its periphery. At least one surface of the openings is metallized. The substrate has a lead thermocompression-bonded to at least one opening.

Figure 1:
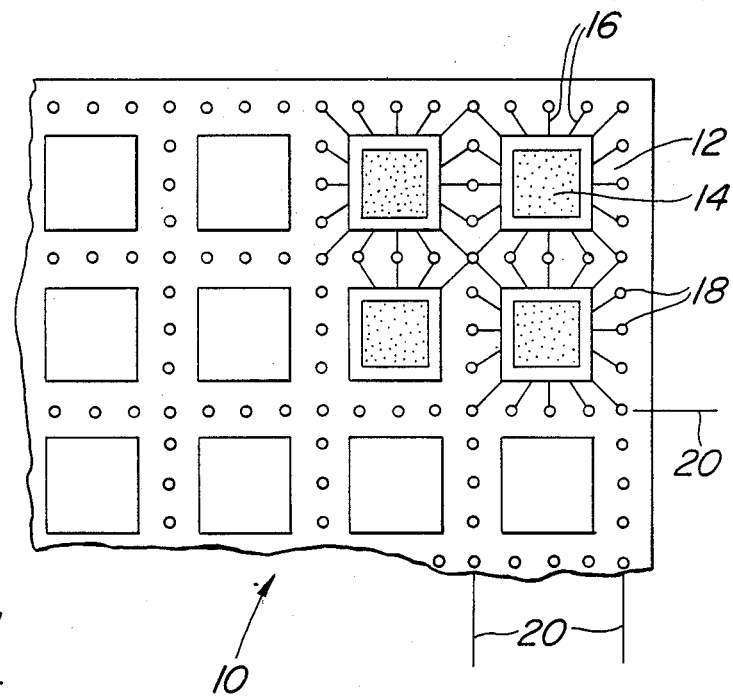
FIG. 1 shows an array of individual substrates in accordance with the prior art.

For the purpose of illustrating the invention, there is shown in the drawings a form which is presently preferred; it being understood, however, that this invention is not limited to the precise arrangements and instrumentalities shown.

DETAILED DESCRIPTION OF THE INVENTION

Referring now to the drawings, wherein like numerals indicate like elements, there is shown in FIG. 1 an array 10 of individual substrates 12 in accordance with the prior art. A plurality of circular perforations or holes 18 are formed in array 10 along score lines 20, which define the periphery of individual substrates 12. Individual substrates 12 are obtained by breaking the array 10 along the score lines. The resulting individual substrates 12 have a plurality of semi-circular openings 19 around the periphery thereof. See FIG. 5.

Each individual substrate 12 has a microcircuit chip bonding area 14. Bonding area, or bonding pad, 14 is typically a metallized area to which individual microcircuit chips (not shown) to attached by conventional bonding method, such as adhesive bonding or eutectic bonding. Individual substrates 12 also have a plurality of metallized conductors 16 which extend from an area surrounding bonding pad 14 to semi-circular openings 19. A metallized layer 24 of conductive material forms a conductive path from the surface of opening 19 to metallized conductors 16, in known manner. Leads are attached to substrate 12 at semicircular opening 19 to permit the substrate to be connected to a circuit board. Gold or aluminum wires (not shown) are connected from conductors 16 to locations on the microcircuit chip to complete the circuit path from the leads to the chip.

Figure 5:
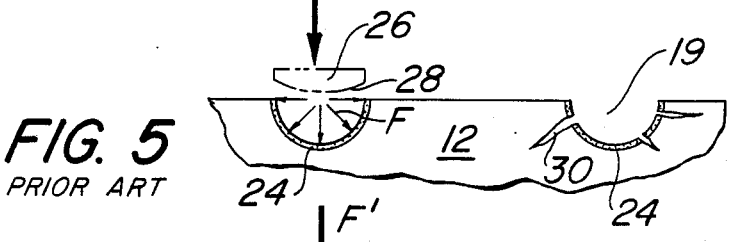
FIG. 5 is a schematic representation of lead bonding to a substrate in accordance with the prior art, illustrating the bonding forces on the substrate.

As best seen in FIG. 5, semi-circular openings 19 do not permit leads to thermocompression bonded to the sides of a substrate 12. As illustrated schematically in FIG. 5, a lead 26 to be bonded and having a rounded face 28 is placed in a semi-circular opening 19. In thermocompression bonding lead 26 to substrate 12, lead 26 is placed in semi-circular opening 19 and bonded to metallized layer 24 by heat and pressure. Lead 26 is forced against layer 24 by bonding force F'. Lead 26 deforms under force F' as force F' compresses the lead against the metallized layer 24. Because of the semi-circular shape of openings 19, force F' resolves itself into radial forces F, which act along radii of semi-circular opening 19. Each radial force F has tangential components which act along tangents to the semi-circular opening 19. The net result of these forces is a tensile stress on semi-circular openings 19. Because ceramics are very weak in tension, the tensile stress causes cracks 30 in the substrate. Cracks 30 lead to degraded electrical performance of the microcircuit chip, and usually require the device to be scrapped.

Figure 2:
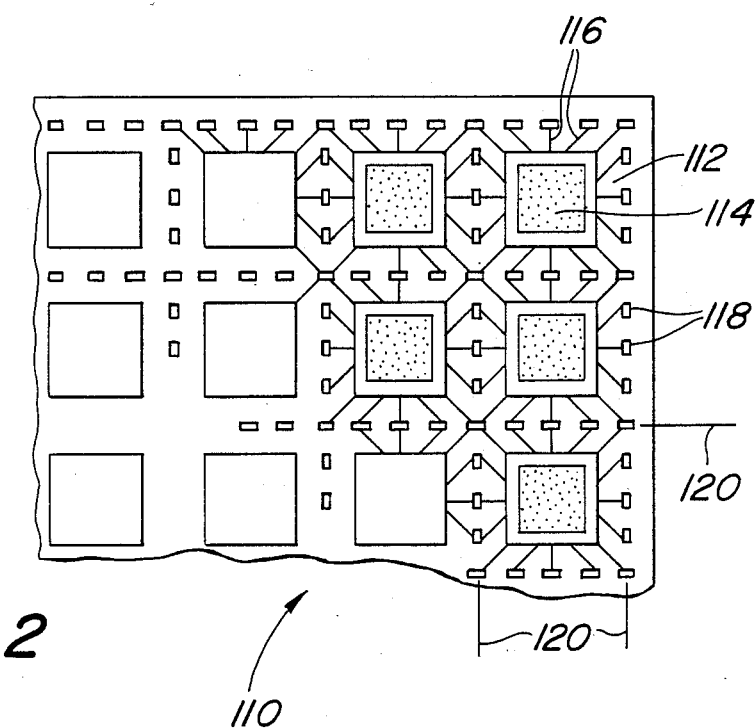
FIG. 2 shows an array of individual substrates according to the present invention.

The present invention eliminates the tensile forces on the substrate which result when attempting to thermocompression bond leads to semi-circular openings. As shown in FIG. 2, in accordance with the present invention an array 110 of individual substrate 112 is constructed as in the prior art, except that the perforations or holes 118 which define the score lines 120 are rectangular rather than circular. (It should be understood that rectangular includes holes which have four equal sides, i.e., are square.)

Figure 3:
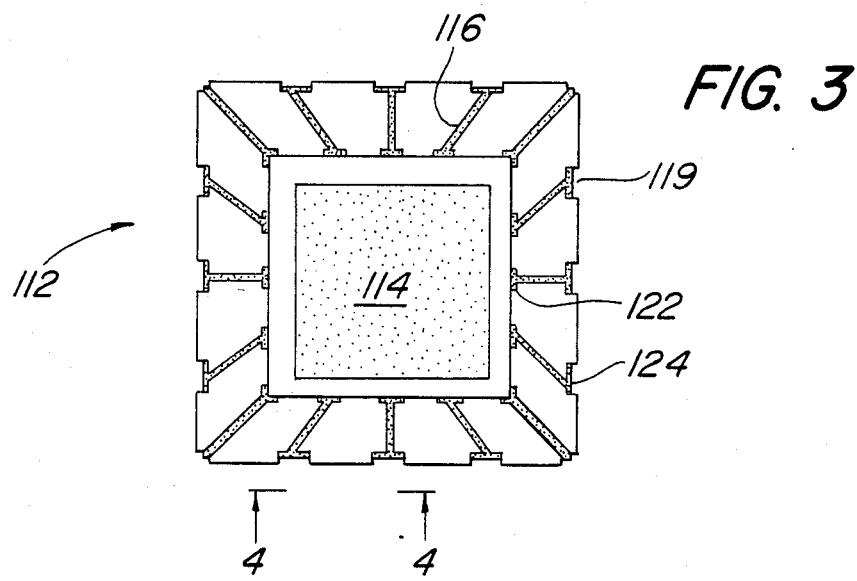
FIG. 3 is a plan view of an individual substrate in accordance with the present invention.

As best seen in FIG. 3, the substrate 112 of the present invention has a bonding area 114 and a plurality of conductors 116. Each conductor 116 has a bonding pad 122 adjacent the chip bonding area to enable wires to be connected from the conductors 116 to the microcircuit chip.

Figure 4:
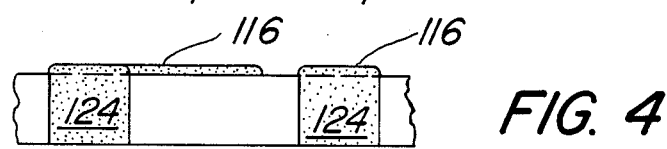
FIG. 4 is a partial elevation view of an individual substrate taken along the line 4—4 of FIG. 3.

Each substrate 112 has a plurality of semi-rectangular openings 119 around its periphery. At least one surface of the semi-rectangular opening has a metallized layer 124 which is physically and electrically connected to conductor 116. See FIG. 4.

Figure 6:
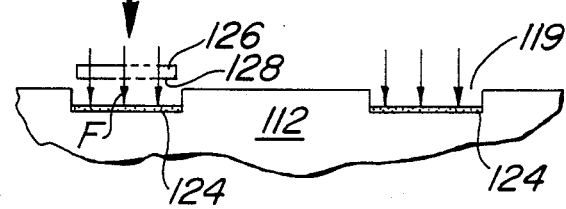
FIG. 6 is a schematic representation of thermocompression bonding a lead to a substrate of the present invention, showing the bonding forces on the substrate.

FIG. 6 illustrates schematically the way in which a lead 126 may be thermocompression bonded to substrate 112. Lead 126 has a flat face 128 which is placed next to metallized area 124 and subjected to thermocompression bonding force F'. Force F' is distributed across the area of lead surface 128. However, because opening 119 is semi-rectangular, there is no tangential component to the bonding force F'. Thus, all of the force F' is distributed across metallized area 124 as compression force. Since ceramic materials can withstand very large compression forces, there is no likelihood of damage to the substrate by the bonding force. In addition, since there is no tangential component of the bonding force F', there are no tensile forces anywhere along the periphery of holes 119. According, the danger of tensile failure is eliminated.

The foregoing invention provides a simple, effective way of thermocompression-bonding leads to the sides of ceramic substrates while at the same time eliminating the problems experienced with thermocompression bonding in the past. The invention enables electronic microcircuits to be manufactured simply, inexpensively and reliably.

The present invention may be embodied in other specific forms without departing from the spirit or essential attributes thereof, and, accordingly, reference should be made to the appended claims, rather than to the foregoing specification, as indicating the scope of the invention.

I claim:

1. Method of making individual microcircuit ceramic substrates, comprising the steps of:
   (a) constructing an integral array of a plurality of individual substrates on a sheet of ceramic material,
   (b) forming rectangular holes in the ceramic material along score lines which define the periphery of individual substrates,
   (c) separating the individual substrates from the array by breaking the array along the score lines to yield individual substrates having semi-rectangular openings around the periphery of each substrate,
   (d) metallizing at least one surface of the semi-rectangular openings, and
   (e) compression bonding leads to the substrate at the semi-rectangular openings at temperatures below brazing temperatures.

2. Method according to claim 1, wherein said compression bonding step comprises thermocompression bonding.

3. Method according to claim 1, wherein the compression bonding step comprises thermosonic bonding.

4. Method according to claim 1, wherein said forming step comprises punching.

* * * * *